US012666995B2

(12) United States Patent
    Tao et al.

(10) Patent No.: US 12,666,995 B2
(45) Date of Patent: Jun. 23, 2026

(54) PACKAGE STRUCTURE

(71) Applicant: YANGTZE MEMORY TECHNOLOGIES CO., LTD., Wuhan (CN)

(72) Inventors: Li Tao, Wuhan (CN); Baohua Zhang, Wuhan (CN); Shanshan Zhao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 317 days.

(21) Appl. No.: 18/364,217

(22) Filed: Aug. 2, 2023

(65) Prior Publication Data

US 2024/0363460 A1      Oct. 31, 2024

(30) Foreign Application Priority Data

Apr. 25, 2023    (CN) .......................... 202310458049.0

(51) Int. Cl.
    H10W 74/10        (2026.01)
    H10W 74/01        (2026.01)
    H10W 74/47        (2026.01)
(52) U.S. Cl.
    CPC ........ H10W 74/111 (2026.01); H10W 74/016 (2026.01); H10W 74/47 (2026.01)
(58) Field of Classification Search
    CPC . H01L 23/3107; H01L 21/565; H01L 23/293; H10W 74/111; H10W 74/016; H10W 74/47
    See application file for complete search history.

(56) References Cited

U.S. PATENT DOCUMENTS

| | | | | |
|---|---|---|---|---|
| 2003/0071348 A1* | 4/2003 | Eguchi | ................ | H01L 25/0655 257/E23.092 |
| 2005/0258552 A1* | 11/2005 | Kim | ...................... | H01L 21/565 257/E23.125 |
| 2011/0204505 A1* | 8/2011 | Pagaila | ................... | H01L 24/97 438/109 |
| 2012/0001177 A1* | 1/2012 | Miyoshi | ................ | H10W 90/00 257/E23.168 |
| 2013/0154105 A1* | 6/2013 | Do | ......................... | H01L 21/565 257/774 |
| 2015/0270232 A1* | 9/2015 | Chen | ...................... | H01L 21/568 257/691 |
| 2016/0326299 A1* | 11/2016 | Chun | ...................... | H01L 23/29 |
| 2017/0062357 A1* | 3/2017 | Kamgaing | .......... | H01L 25/0657 |
| 2017/0117214 A1* | 4/2017 | Park | .................... | H01L 25/0657 |
| 2017/0345788 A1* | 11/2017 | Pan | ........................ | H01L 24/29 |
| 2018/0130749 A1* | 5/2018 | Tsai | ..................... | H01L 21/6835 |
| 2020/0321301 A1* | 10/2020 | Mitarai | .............. | H01L 23/3107 |
| 2023/0207443 A1* | 6/2023 | Murayama | .......... | H01L 23/3135 257/787 |
| 2024/0347436 A1* | 10/2024 | Shibata | ................... | H01L 24/13 |

\* cited by examiner

*Primary Examiner* — Eugene Lee
(74) *Attorney, Agent, or Firm* — Conley Rose, P.C

(57)                ABSTRACT

Examples of the present disclosure provide a package structure, the package structure including: a package substrate; a semiconductor device on the package substrate; and a molding layer over the semiconductor device, the molding layer having a plurality of grooves disposed at its surface.

20 Claims, 5 Drawing Sheets

S1001 — PROVIDING A PACKAGING SUBSTRATE

S1002 — DISPOSING A SEMICONDUCTOR DEVICE ON THE PACKAGING SUBSTRATE

S1003 — FORMING A MOLDING LAYER OVER THE SEMICONDUCTOR DEVICE, THE MOLDING LAYER HAVING A PLURALITY OF RECESSES DISPOSED AT ITS SURFACE

101

102

103

103

104
101
102
103

104

0.039848 MAX
0.005356
0.090863
0.026371
0.021070
0.017386
0.012893
0.0084007
0.0039082
-0.00058431 MIN 0.012759 MAX
0.011232
0.0097047
0.0081778
0.0066509
0.005124
0.0035971
0.0020702
0.00054333
-0.00098357 MIN

PACKAGE STRUCTURE

CROSS-REFERENCE TO RELATED APPLICATIONS

The present application claims priority to Chinese Patent Application No. 2023104580490, which was filed Apr. 25, 2023, is titled "PACKAGE STRUCTURE AND FORMING METHOD THEREOF," and is hereby incorporated herein by reference in its entirety.

TECHNICAL FIELD

The present disclosure relates to the field of semiconductor technology and particularly to a package structure and a forming method thereof.

BACKGROUND

Packaging of semiconductor structures is an element of a semiconductor fabrication process. A package structure includes a molding layer, a semiconductor device, a package substrate, solder balls and the like. With increasing demands for higher integration level and reliability of semiconductor structures, packaging technology faces more and more challenges.

SUMMARY

In some examples of the present disclosure, a package structure is provided, the package structure including: a package substrate; a semiconductor device on the package substrate; and a molding layer over the semiconductor device, the molding layer including a plurality of grooves disposed at its surface.

In the example above, the package structure further includes at least one independent patch structure each being located in one of the grooves.

In the example above, the independent patch structure has a coefficient of thermal expansion greater than that of the molding layer.

In the example above, the independent patch structure includes at least one of: resin, glue or copper.

In the example above, the independent patch structure has a coefficient of thermal expansion smaller than that of the molding layer.

In the example above, the independent patch structure includes silicon.

In the example above, the package structure includes a plurality of regions arranged in the direction perpendicular to the thickness direction of the package and the independent patch structures in the grooves corresponding to each of the regions have different coefficients of thermal expansion, or have different densities.

In the example above, the thermal conductivity of the independent patch structure is greater than a preset value.

In the example above, the preset value is 160 Watts (W)/milli-Kelvin (mK).

In the example above, the contour of the independent patch structure has the same shape as the contour of the groove.

In the example above, the dimension of the independent patch structure is larger than that of a corresponding portion of the groove.

In the example above, the contour of the independent patch structure has the shape of at least one of: a cylinder, a circular cone, a triangular pyramid, a hemisphere or a cube.

In the example above, the semiconductor device includes a three-dimensional NAND memory.

In accordance with the second aspect of examples of the present disclosure, a method of forming a package structure is provided, the method including: providing a package substrate; disposing a semiconductor device on the package substrate; and forming a molding layer over the semiconductor device, the molding layer including a plurality of grooves disposed at its surface.

In the example above, the method further includes: disposing an independent patch structure in each of at least one of the plurality of grooves.

In the example above, disposing the independent patch structure in each of at least one of the plurality of grooves includes: adding the independent patch structures including a coefficient of thermal expansion greater than that of the molding layer into the grooves, when the package structure warps toward the side of the molding layer in the thickness direction of the package structure.

In the example above, the independent patch structure includes at least one of: resin, glue or copper.

In the example above, disposing the independent patch structure in each of at least one of the plurality of grooves includes: adding the independent patch structures including a coefficient of thermal expansion smaller than that of the molding layer into the grooves, when the package structure warps toward the side of the package substrate in the thickness direction the package structure.

In the example above, the independent patch structure includes silicon.

In the example above, disposing the independent patch structure in each of at least one of the plurality of grooves includes: when the package structure includes a plurality of regions arranged in the direction perpendicular to the thickness direction of the package and each of the regions has a different level of warpage in the thickness direction of the thickness of the package structure, adding independent patch structures with different coefficients of thermal expansion into the grooves corresponding to each of the regions, or adding independent patch structures including different densities into the grooves corresponding to each of the regions.

Examples of the present disclosure provide a package structure and a forming method thereof. The method includes: providing a package substrate; disposing a semiconductor device on the package substrate; and forming a molding layer over the semiconductor device with a plurality of grooves disposed at the surface thereof. In examples of the present disclosure, in a first aspect, a plurality of grooves are disposed at the surface of the molding layer. Independent patch structures can be added into or removed from the grooves disposed in the molding layer dynamically depending on the warpage of the package structure. Independent patch structures of different coefficients of thermal expansion can be chosen flexibly according to different deformation orientations and deformation levels of warpage of the package structure, to improve the package structure with respect to warpage. In a second aspect, since the independent patch structures are not fixed in the package structure as an immovable part. Independent patch structures can be added or removed dynamically depending on different instances of warpage of the package structure in different environments, and thereby the package structure can adapt to a greater variety of environments and have a wider range of application. In a third aspect, the dimensions of the package structure in examples of the present disclosure are not increased, and thus there is no influence on the integration of the package structure.

DETAILED DESCRIPTION

Figure 1:
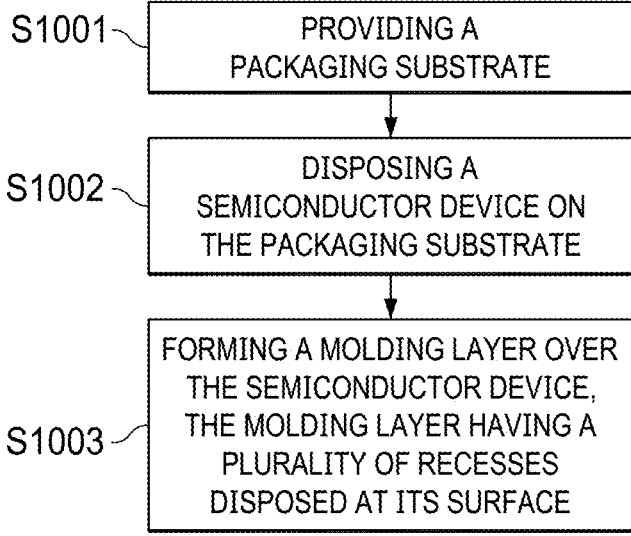
FIG. 1 is a flow chat of a method of forming a package structure provided in an example of the present disclosure.

Hereinafter, example examples disclosed by the present disclosure will be described in more detail with reference to accompanying drawings. Although example examples of the present disclosure are illustrated in accompanying drawings, it should be understood that the present disclosure can be embodied in various forms and is not limited to specific examples described herein. The examples are provided for more thorough understanding of the present disclosure and to convey the scope disclosed by the present disclosure fully to those skilled in the art.

In the description hereafter, many specific details are provided to facilitate more thorough understanding of the present disclosure. However, for those skilled in the art that the present disclosure can be implemented without one or more of these details. In other examples, in order not to obscure the present disclosure, some technical features well known in the art will not be described. That is to say, not all features of practical examples will be described herein and well-known functions and structures will not be described in detail.

In accompanying drawings, dimensions and relative sizes of layers, regions and elements may be exaggerated for clearance. The same reference numerals refer to the same elements throughout the specification.

When an element or a layer is said to be "over," "adjacent to." "connected to" or "coupled to" an other element or layer, it may be directly over, adjacent to, connected to or coupled to the other element or layer or an intervening element or layer may exist therebetween. When an element is said to be "directly on." "directly adjacent to." "directly connected to" or "directly coupled to" an other element or layer, there is no intervening element or layer therebetween. Although various elements, components, regions, layers and/or parts may be described using terms "first," "second." "third" or the like, they are not limited by those terms. The terms are only used to distinguish one element, component, region, layer or part from another element, component, region, layer or part. Therefore, a first element, component, region, layer or part discussed hereafter may be instead expressed as a second element, component, region, layer or part without departing from the teaching of the present disclosure. When a second element, component, region, layer or part is in discussion, it is not intended to indicate that a first element, component, region, layer or part must exist.

Spatially relative terms, such as "below," "beneath," "lower." "under," "over" and "above." are used herein for ease of description to explain the relationship of one element or feature with other elements or features as shown in the figures. In addition to the orientations shown in the figures, different orientations of devices in use and operation are also intended to be covered by those spatially relative terms. For example, if a device in a drawing is turned upside down, the element or feature described to be "beneath," "under" or "below" an other element or feature will have the orientation of being "over" the other element or feature. Therefore, example terms "beneath" and "under" may include orientations of both "below" and "above." Devices may be otherwise oriented (rotated 90 degrees or at other orientations) and the spatially relative descriptors used herein may likewise be interpreted accordingly.

Terminology is used herein only for description of specific examples and in no way for limiting the present disclosure. As used herein, the terms "a." "an" and "the" in singular forms are also intended to cover plural forms, unless the context clearly indicates otherwise. The terms "comprise." "comprising." "include" and/or "including." as used in the specification, specify presence of the mentioned features, integers, steps, operations, elements and/or components, but do not exclude presence or addition of one or more other features, integers, steps, operations, elements, components and/or combinations thereof. As used herein, the term "and/or" includes any and all combinations of relevant listed items.

In order to disclose characteristics and technical contents of examples of the present disclosure more thoroughly, examples of the present disclosure will be described in detail hereafter with reference to accompanying drawings, which are only for reference and illustration and not for definition of examples of the present disclosure.

With integrated circuits getting more powerful and their performance and integration levels becoming higher and with the advent of new types of integrated circuits, packaging technology plays a role of increasing importance in integrated circuit products and makes up an increasing proportion of the value of a whole electronic system. Meanwhile, as dimensions of integrated circuits reached nanoscale, transistors have been developed with a higher density and a higher clock frequency and packages have been developed with a higher density.

In order to meet demands for development, ball grid array (BGA) packaging has been applied in production as a high-density surface mounting packaging technology, in which ball-shaped pins are arranged at the bottom of a package in a pattern like a grid and thus called as a BGA. Such packaging technology is used in chip sets for controlling in a mainboard. A memory packaged with the BGA technology can have a capacity increased by one or two times with the same volume or may have a smaller volume, better heat radiation and higher electrical performance.

A package structure includes a package substrate, a semiconductor device disposed on the package substrate, a molding layer covering the semiconductor device and the like. In practical applications, due to mismatching thermal expansion coefficients of and thickness differences between constituent parts of a package structure, when the environment temperature changes dramatically, for example, increases or decreases dramatically, the package structure is prone to warpage and deformation. This may cause cracks in the semiconductor device or delamination of the semiconductor device from the package substrate or leads, and in turn result in failure of the semiconductor device, lowering the semiconductor device's reliability and constraining its application scenarios. Currently, to make improvement with respect to warpage, work for design of experiment (DOE) is performed to adjust the structure and material of a package structure, however this consumes a great amount of time and human and material resources. Therefore, it may be advantageous to improve package structures with respect to warpage and deformation.

Figure 2:
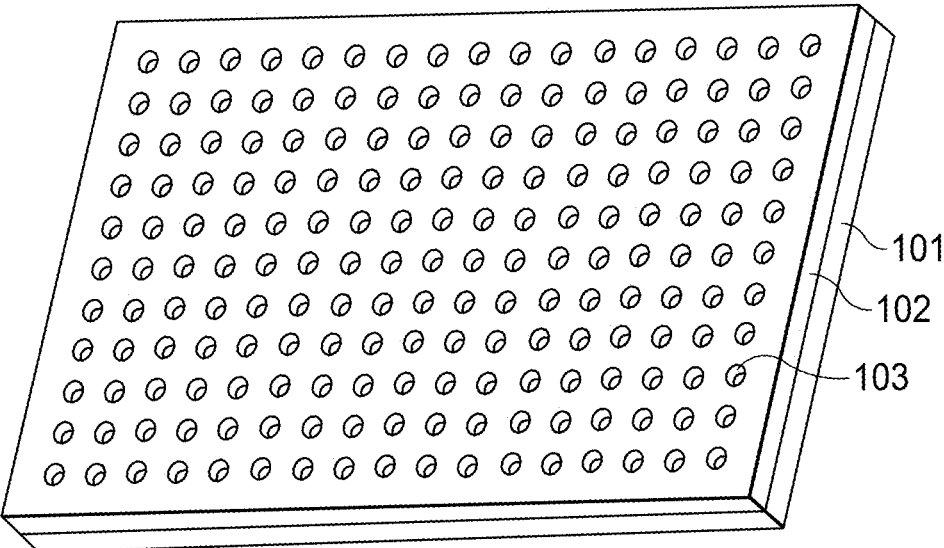
FIG. 2 is the first structural diagram illustrating a package structure provided in an example of the present disclosure.
Figure 3:
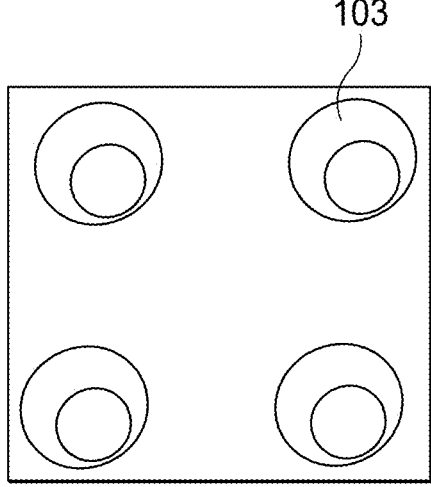
FIG. 3 is a structural diagram of grooves in a package structure provided in an example of the present disclosure.

In view of the above-mentioned issue, examples of the present disclosure provide a method of forming a package structure. As shown in FIGS. 1, 2 and 3, the method includes: operation S1001 of providing a package substrate 101; operation S1002 of disposing a semiconductor device on the package substrate 101; and operation S1003 of forming a molding layer 102 over the semiconductor device, the molding layer 102 having a plurality of grooves 103 disposed at its surface.

FIG. 3 is an enlarged partial view showing the surface of the molding layer 102 in FIG. 2.

In some examples, the process of forming the molding layer 102 includes: providing an injection mold; and forming the molding layer 102 using the injection mold. A given number of holes each having a designed shape are left at the surface of the molding body through the injection mold to form the grooves 103 at the surface of the molding layer 102.

Figures 4, 5:
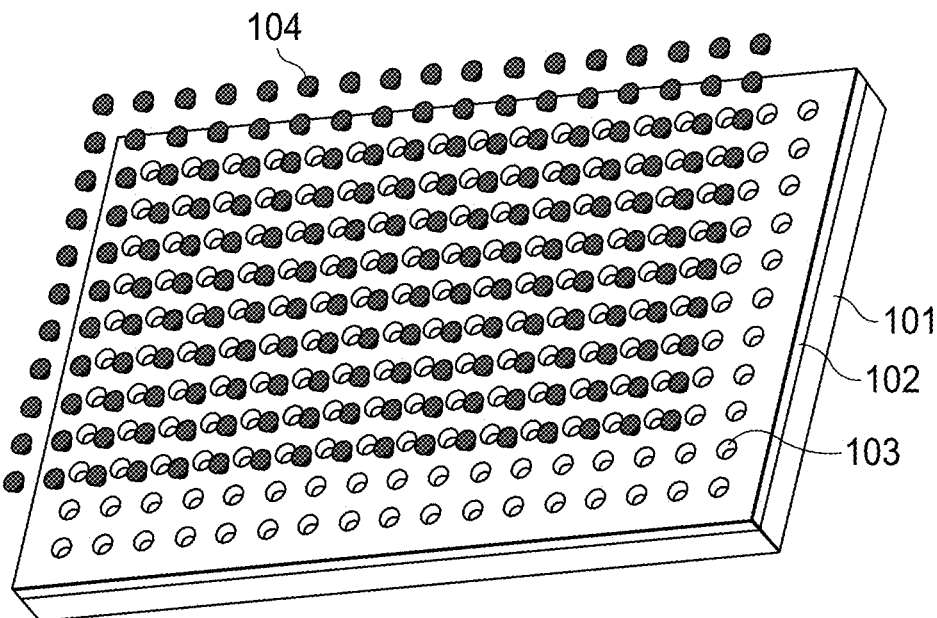
FIG. 4 is the second structural diagram illustrating a package structure provided in an example of the present disclosure.
FIG. 5 is a structural diagram of independent patch structures of a package structure provided in an example of the present disclosure.

In some examples, as shown in FIGS. 4 and 5, the method further includes: disposing an independent patch structure 104 in each of at least one of the plurality of grooves 103.

In some examples, a plurality of independent patch structures 104 may be formed using a molding module and placed into the grooves 103 as needed. However, the independent patch structures 104 are not limited to being formed with this method.

FIG. 5 is an enlarged structural diagram of the independent patch structures.

In examples of the present disclosure, a plurality of grooves 103 are disposed at the surface of the molding layer 102, so that independent patch structures 104 can be added into or removed from the grooves 103 dynamically depending on the warpage of the package structure with each of the independent patch structures 104 fitting into each groove 103 and having a coefficient of thermal expansion different from that of the material of the molding layer 102. As a result, the package structure can be improved with respect to warpage and, since the independent patch structures 104 can be added or removed flexibly, the warpage of the package structure can be regulated rapidly, saving the time and cost for DOE package fabrication and increasing the efficiency of regulating the warpage of the package structure.

In one aspect, the thermal expansion coefficient of the material of the molding layer 102 is different from that of the material of the semiconductor device or the package substrate 101. In another aspect, there is a difference between the thickness of the package substrate 101 and the thickness of the molding layer 102. Due to the factors in the two aspects, the package structure is prone to warpage. When the capability of expansion or shrinkage of the molding layer 102 is weaker than that of the package substrate 101, the higher level of expansion or shrinkage on the side of the package substrate 101 will cause warpage of the package structure toward the side of the molding layer 102 in the thickness direction of the package structure. When the capability of expansion or shrinkage of the molding layer 102 is stronger than that of the package substrate 101, the higher level of expansion or shrinkage on the side of the molding layer 102 will cause warpage of the package structure toward the side of the package substrate 101 in the thickness direction of the package structure. For example, in practical applications, there may be various instances of warpage for the package substrate 101.

How to add independent patch structures depending on the direction toward which the package structure warps will be described in detail hereafter.

In some examples, disposing an independent patch structure 104 in each of at least one of the plurality of grooves 103 includes: adding independent patch structures 104 having a coefficient of thermal expansion greater than that of the molding layer 102 into the grooves 103 when the package structure warps toward the side of the molding layer 102 in the thickness direction of the package structure.

Figures 6, 7:
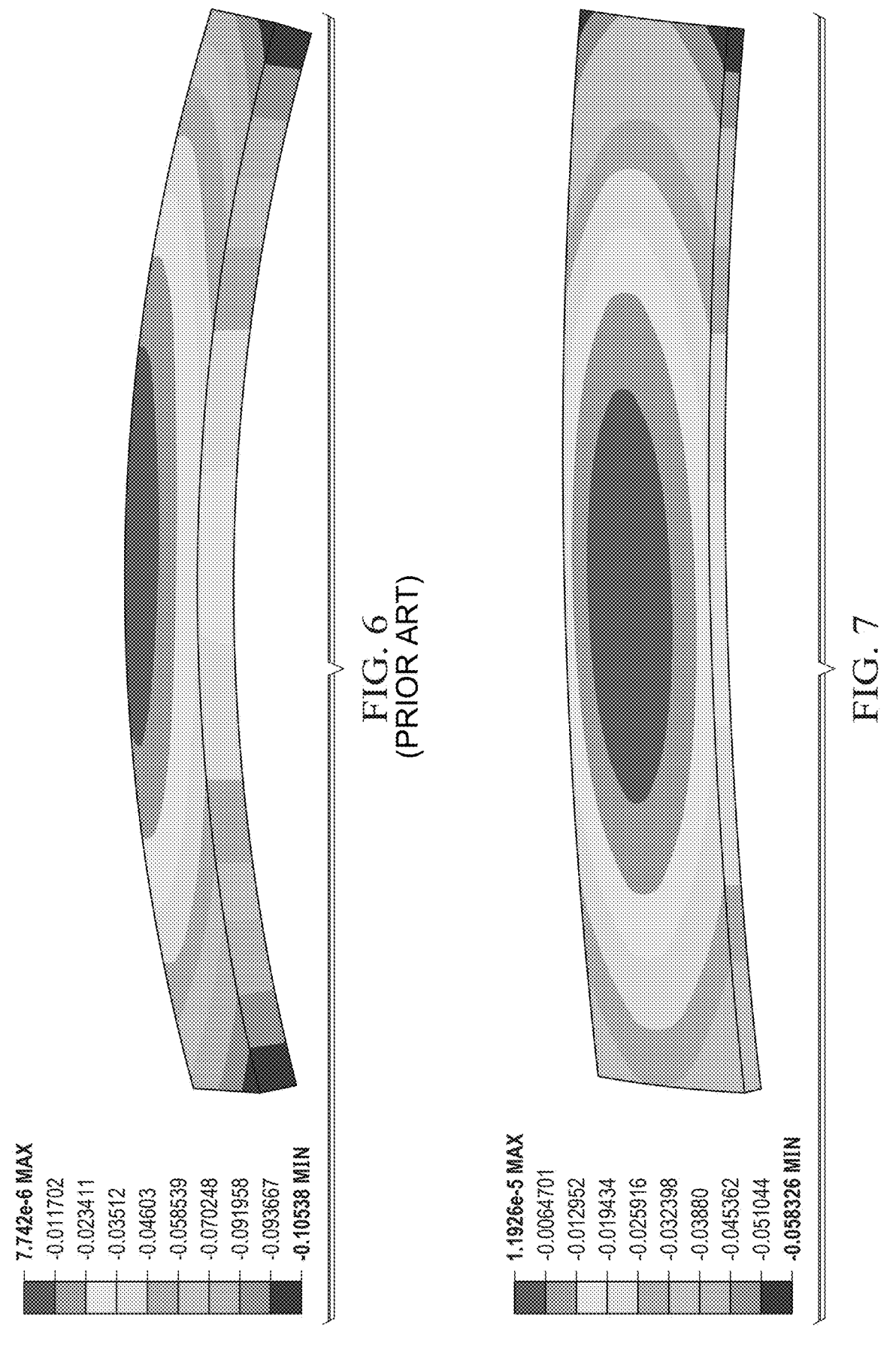
FIG. 6 is the first diagram illustrating warpage simulation of a package structure provided in the related art.
FIG. 7 is the first diagram illustrating warpage simulation of a package structure provided in an example of the present disclosure.

FIGS. 6 and 7 are pictures showing simulation results of warpage of a package structure provided in the related art and a package structure provided in examples of the present disclosure, respectively. The warpage of the package structure toward the side of the molding layer 102 in the thickness direction of the package structure may be understood as an upward convex of the package structure, as shown in FIG. 6. With reference to both FIG. 6 and FIG. 7, in case of the warpage toward the side of the molding layer 102 in the thickness direction of the package structure, the level of warpage of the package structure having the added independent patch structures 104 with a coefficient of thermal expansion greater than that of the molding layer is less than the level of warpage of the package structure without any independent patch structure 104.

To provide reliability of the simulation results, the only difference between the package structure provided in the related art and the package structure provided in examples of the present disclosure is the addition of independent patch structures 104 into the grooves 103 of the molding layer 102 of the package structure provided in examples of the present disclosure.

In accordance with the simulation results above, in contrast to the package structure in the related art, the package structure provided in examples of the present disclosure that has a molding layer 102 with grooves 103 disposed at its surface and has independent patch structures 104 added into the grooves 103 have a higher capability of resisting warpage.

In case of the warpage of the package structure toward the side of the molding layer 102 in the thickness direction of the package structure, the capability of expansion or shrinkage of the molding layer 102 is weaker than that of the package substrate 101. The independent patch structures 104 added into the grooves 103 and having a coefficient of thermal expansion greater than that of the molding layer 102 can enhance the capability of expansion or shrinkage of the molding layer and thus reduce the difference in expansion or shrinkage between the molding layer 102 and the package substrate 101, causing a force pointing to the center of the package structure in the direction perpendicular to the thickness direction of the package substrate 101. Under the force, the package structure can have a lower level of deformation and the package can be improved with respect to warpage.

In some examples, the independent patch structures 104 may include at least one of: resin, glue or copper.

In some specific examples, the material of the independent patch structures 104 is resin that has a coefficient of thermal expansion of 9 parts-per-million (ppm)/Kelvin (K)-12 ppm/K at a first temperature and a coefficient of thermal expansion of 35 pm/K-40 ppm/K at a second temperature. The first temperature is lower than the second temperature. For example, the first temperature may be the normal temperature and the second temperature may be a high temperature of about 200° C.

In some specific examples, the molding layer has a coefficient of thermal expansion of 5 ppm/K-9 ppm/K at the first temperature and has a coefficient of thermal expansion of 30 pm/K-35 ppm/K at the second temperature.

The molding layer may also include resin, which has a coefficient of thermal expansion smaller than that of the material of the independent patch structures. Resin may include various constituents including, for example, resin acids, resin alcohols, resin esters, resin hydrocarbons and the like, and the proportions of different constituents of a resin material to be formed may be adjusted in practical applications to make the resin material have a different coefficient of thermal expansion.

The material of the independent patch structures 104 given in the examples above is only an example and means no limitation on the material of the independent patch structures 104 in any other examples of the present disclosure. The above-mentioned ranges of the thermal expansion coefficients of the independent patch structures and the molding layer are only examples and can be chosen as desired in practical applications.

In some examples, the thermal conductivity of the independent patch structures 104 is greater than a preset value.

In some examples, the preset value is 160 Watts (W)/mK.

Illustratively, when having silicon as their material, the independent patch structures 104 have a thermal conductivity of 180 W/milli-Kelvin (mK).

The range of thermal conductivity of the independent patch structures 104 provided in the examples above is only an example and means no limitation on the range of thermal conductivity of the independent patch structures 104 in examples of the present disclosure.

In one aspect, the independent patch structures 104 in examples of the present disclosure may have a material with a relatively high thermal conductivity, so that the average thermal conductivity of the package structure at its upper surface may be increased to make the heat, generated in the package structure, conducted to outside while the package structure is improved with respect to warpage. In another aspect, a plurality of grooves are disposed at the surface of the molding layer and those having no independent patch structures added therein can increase the area for heat dissipating at the upper surface of the molding layer, improving the performance of heat dissipating of the package structure.

In examples of the present disclosure, the material of the independent patch structures 104 may have a high strength, so that the independent patch structures 104 can not only improve the issue of warpage but also enhance the strength of the package structure and thus increase its reliability.

In some examples, disposing an independent patch structure 104 in each of at least one of the plurality of grooves 103 includes: adding independent patch structures 104 having a coefficient of thermal expansion smaller than that of the molding layer 102 into the grooves 103 when the package structure warps toward the side of the package substrate 101 in the thickness direction of the package structure.

Figures 8, 9:
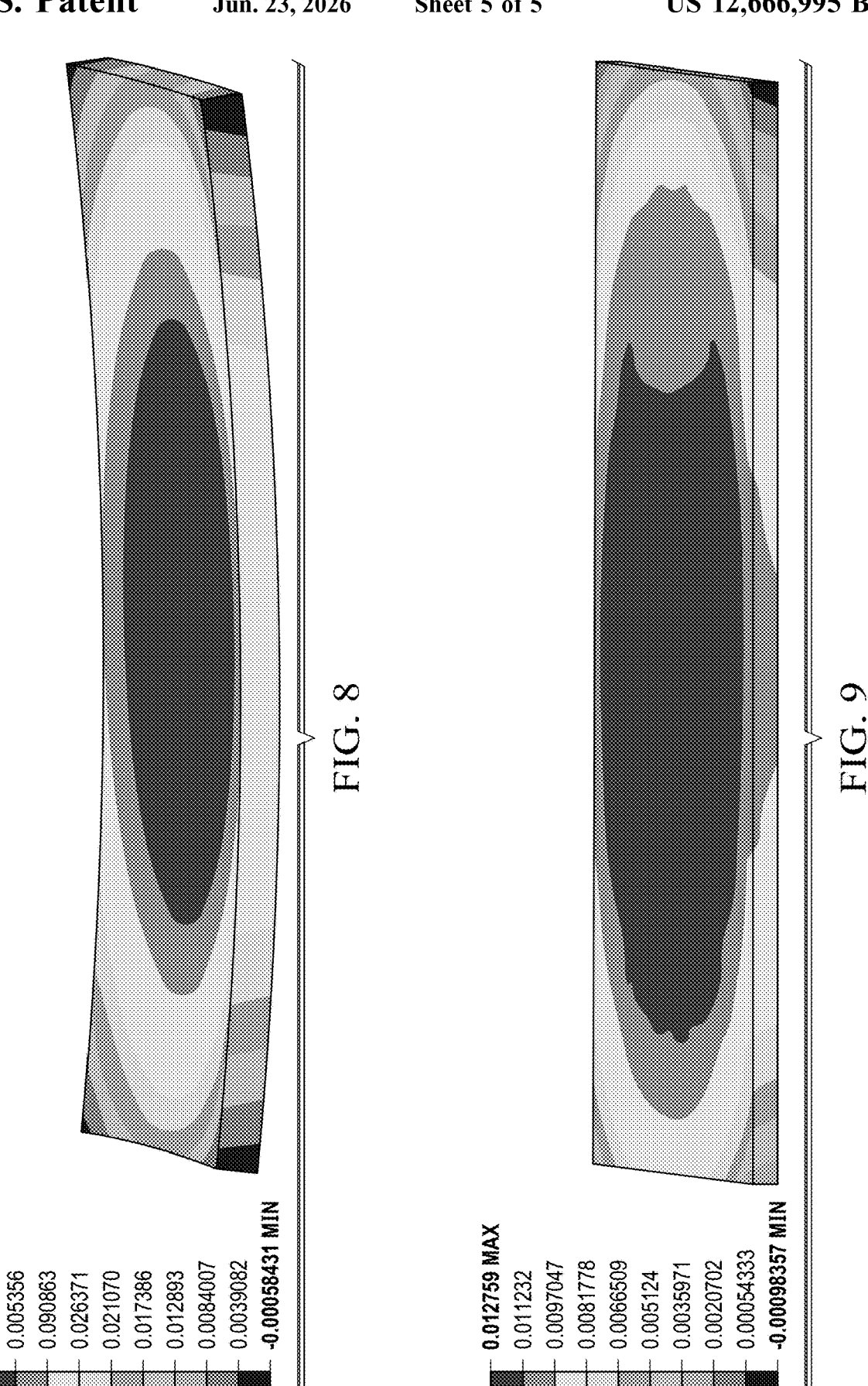
FIG. 8 is the second diagram illustrating warpage simulation of a package structure provided in the related art.
FIG. 9 is the second diagram illustrating warpage simulation of a package structure provided in an example of the present disclosure.

FIGS. 8 and 9 are pictures showing simulation results of warpage of a package structure provided in the related art and a package structure provided in examples of the present disclosure respectively. The warpage of the package structure toward the side of the package substrate 101 in the thickness direction of the package structure may be understood as a downward concave of the package structure, as shown in FIG. 7. With reference to both FIG. 8 and FIG. 9, in case of the warpage toward the side of the package substrate 101 in the thickness direction of the package structure, the level of warpage of the package structure having the added independent patch structures 104 with a coefficient of thermal expansion smaller than that of the molding layer 102 is lower than the level of warpage of the package structure without any independent patch structure 104.

In case of the warpage of the package structure toward the side of the package substrate 101 in the thickness direction of the package structure, the capability of expansion or shrinkage of the package substrate 101 is weaker than that of the molding layer 102. The independent patch structures 104 added into the grooves 103 and having a coefficient of thermal expansion smaller than that of the molding layer 102 can enhance the capability of expansion or shrinkage of the package substrate 101 and thus reduce the difference in expansion or shrinkage between the molding layer and the package substrate 101, causing a force pointing to a direction away from the center of the package structure and perpendicular to the thickness direction of the package substrate 101. Under the force, the package structure can have a lower level of deformation and the package can be improved with respect to warpage.

In some examples, the independent patch structures 104 may include, but not be limited to, silicon.

The silicon may have a coefficient of thermal expansion of about 2 ppm/K.

In some examples, disposing an independent patch structure 104 in each of at least one of the plurality of grooves 103 includes: when the package structure includes a plurality of regions arranged in the direction perpendicular to the thickness direction of the package and each of the regions has a different level of warpage in the thickness direction of the package structure, adding independent patch structures 104 with different coefficients of thermal expansion into the grooves corresponding to each of the regions, or adding independent patch structures 104 having different densities into the grooves 103 corresponding to each of the regions.

In practical applications, different regions of the same package structure may have different levels of warpage. The warpage of each of the regions may be adjusted by adding independent patch structures 104 according to different densities or adding independent patch structures 104 of different coefficients of thermal expansion in the region to further improve the issue of warpage.

In some other examples, the package structure includes a plurality of regions arranged in the direction perpendicular to the thickness direction of the package and the plurality of regions may each have a different orientation of warpage in the thickness direction of the package structure. Therefore, a different type of independent patch structures may be added in each of the regions. Illustratively, independent patch structures 104 of a coefficient of thermal expansion greater than that of the molding layer 102 may be added in any region with warpage toward the side of the molding layer 102. Independent patch structures 104 of a coefficient of thermal expansion smaller than that of the molding layer 102 may be added in any region with warpage toward the side of the package substrate 101.

In some examples, the warpage of the package structure can be simulated so as to determine a scheme of adjusting independent patch structures, which can regulate warpage of the package structure.

Examples of the present disclosure provide a method of forming a package structure, the method including: providing a package substrate 101; disposing a semiconductor device on the package substrate 101; and forming a molding layer 102 over the semiconductor device with a plurality of grooves disposed at the surface thereof. In examples of the present disclosure, in the first aspect, a plurality of grooves 103 are disposed at the surface of the molding layer 102. Independent patch structures 104 can be added into or removed from the grooves 103 disposed at the surface of the molding layer 102 dynamically depending on the warpage of the package structure. Independent patch structures of different coefficients of thermal expansion can be chosen flexibly according to different deformation orientations and deformation levels of warpage of the package structure to improve the package structure with respect to warpage. In the second aspect, since the independent patch structures 104 are not fixed in the package structure as an immovable part, independent patch structures 104 can be added or removed dynamically depending on different instances of warpage of the package structure in different environments and thereby the package structure can adapt to a greater variety of environments and have a wider range of application. In the third aspect, the dimensions of the package structure in examples of the present disclosure are not increased, and thus there is no influence on integration of the package structure.

Based on the above method of forming a package structure, examples of the present disclosure further provide a package structure. As shown in FIGS. 2 and 3, the package structure includes: a package substrate 101; a semiconductor device on the package substrate 101; and a molding layer 102 over the semiconductor device, the molding layer 102 having a plurality of grooves 103 disposed at its surface.

The semiconductor device is encapsulated by the molding layer and thus not shown in FIG. 2.

In some examples, the semiconductor device includes, but is not limited to, a three-dimensional (3D) NAND memory.

In examples of the present disclosure, independent patch structures 104 may be adjusted dynamically depending on the warpage of the package structure, and therefore the plurality of grooves 103 of examples of the present disclosure may have no independent patch structures 104 therein or some grooves 103 may have independent patch structures 104 therein.

In some examples, as shown in FIG. 4, the package structure further includes at least one independent patch structure 104 each being located in one of the grooves 103.

In some examples, the independent patch structures 104 have a coefficient of thermal expansion greater than that of the molding layer 102.

In some examples, the independent patch structures 104 may include at least one of: resin, glue or copper.

In some examples, the independent patch structures 104 have a coefficient of thermal expansion smaller than that of the molding layer 102.

In some examples, the independent patch structures 104 includes silicon.

In some examples, the package structure includes a plurality of regions arranged in the direction perpendicular to the thickness direction of the package, and the independent patch structures 104 in the grooves 103 corresponding to each of the regions have different coefficients of thermal expansion, or have different densities.

In some examples, the thermal conductivity of the independent patch structures 104 is greater than a preset value.

In some examples, the preset value is 160 W/mK.

In some examples, as shown in FIGS. 4 and 5, the contour of each independent patch structure 104 has the same shape as the contour of each groove 103.

Each independent patch structure 104 of examples of the present disclosure needs to be stuck in one of the grooves 103 and thus in close contact with the molding layer 102. The independent patch structures 104 can be in better contact with the molding layer 102 when the contour of each independent patch structure 104 has the same shape as the contour of each groove 103.

In some examples, the dimension of each independent patch structure 104 is larger than that of a corresponding portion of each groove 103.

In some examples, the dimension of each independent patch structure 104 is larger than that of a corresponding portion of each groove 103 to realize interference fit, so that the independent patch structures 104 can be stuck in the grooves 103 firmly and thus can be prevented from falling out of the groove 103.

In some examples, the contour of each independent patch structure 104 has the shape of at least one of: a cylinder, a circular cone, a triangular pyramid, a hemisphere or a cube.

The contour of each independent patch structure 104 may have any irregular shape other than those shapes listed in the examples above or have a combined shape of the above regular shapes.

Examples of the present disclosure provide a package structure including: a package substrate 101; a semiconductor device on the package substrate 101; and a molding layer 102 over the semiconductor device with a plurality of grooves disposed at the surface thereof. In examples of the present disclosure, in the first aspect, a plurality of grooves 103 are disposed at the surface of the molding layer 102, so that independent patch structures 104 can be added to or removed from the grooves 103 disposed at the surface of the molding layer 102 dynamically depending on warpage of the package structure. Independent patch structures of different coefficients of thermal expansion can be chosen flexibly according to deformation orientations and deformation levels of warpage of the package structure to improve the package structure with respect to warpage. In the second aspect, since the independent patch structures 104 are not fixed in the package structure as an immovable part. Independent patch structures 104 can be added or removed dynamically depending on different instances of warpage of the package structure in different environments, and thereby the package structure can adapt to a greater variety of environments and have a wider range of application. In the third aspect, the dimensions of the package structure in examples of the present disclosure are not increased and thus there is no influence on integration of the package structure.

In the present disclosure, "one example" or "an example" mentioned throughout the specification means that particular features, structures or characteristics in association with the example may be included in at least one example of the present disclosure. Therefore, "in one example" or "in an example" mentioned throughout the specification refers not necessarily to the same example. Moreover, those particular features, structures or characteristics may be incorporated in one or more examples in any suitable manner. It can be understood that, in various examples of the present disclosure, the ordinal numbers of the various processes above are not intended to indicate that the processes must be performed in any sequential order and the various processes should be performed in a sequential order determined depending on their functions and inherent logic. Practice of examples of the present disclosure is not limited in this respect. The ordinal numbers in the above-mentioned examples of the present disclosure are only for the purpose of description and imply no preference for any one or more examples over the others.

Wherever no collisions will occur, the methods disclosed in the several method examples provided by the present disclosure can be combined arbitrarily to obtain new method examples.

What have been described above are only specific examples of the present disclosure. However, the scope of the present disclosure is not limited thereto, and variations or substitutions that easily occur to those skilled in the art in light of the technical contents disclosed by the present disclosure will fall within the scope of the present disclosure. Therefore, the scope of the present disclosure should be determined by the scope of the claims.

What is claimed is:

1. A package structure, comprising:
a package substrate;
a semiconductor device on the package substrate;
a molding layer over the semiconductor device, the molding layer including a plurality of grooves disposed at its surface; and
independent patch structures selectively insertable or removable from the plurality of grooves, wherein a portion of the independent patch structures are insertable into a subset of the plurality of grooves.

2. The package structure of claim 1, further comprising an independent patch structure of the independent patch structures being located in each one of the grooves.

3. The package structure of claim 2, wherein the independent patch structure has a coefficient of thermal expansion greater than that of the molding layer.

4. The package structure of claim 3, wherein the independent patch structure comprises at least one of:
resin, glue or copper.

5. The package structure of claim 2, wherein the independent patch structure has a coefficient of thermal expansion smaller than that of the molding layer.

6. The package structure of claim 5, wherein the independent patch structure comprises silicon.

7. The package structure of claim 2, wherein at least two of the independent patch structures have different coefficients of thermal expansion or have different densities.

8. The package structure of claim 2, wherein a thermal conductivity of the independent patch structure is greater than a preset value.

9. The package structure of claim 8, wherein the preset value is 160 Watts (W)/milli-Kelvin (mK).

10. The package structure of claim 2, wherein a contour of the independent patch structure has a same shape as a contour of at least one of the grooves.

11. The package structure of claim 2, wherein a dimension of the independent patch structure is larger than that of a corresponding portion of at least one of the grooves.

12. The package structure of claim 2, wherein a contour of the independent patch structure has a shape of at least one of:
a cylinder, a circular cone, a triangular pyramid, a hemisphere or a cube.

13. The package structure of claim 1, wherein the semiconductor device comprises a three-dimensional NAND memory.

14. The package structure of claim 1, wherein the independent patch structures comprise pre-formed components formed according to dimensions of the plurality of grooves.

15. The package structure of claim 1, wherein the independent patch structures are formed separate from the molding layer and inserted in finished form into the molding layer.

16. The package structure of claim 1, wherein a first portion of the independent patch structures has a first coefficient of thermal expansion and a second portion of the independent patch structures has a second coefficient of thermal expansion.

17. The package structure of claim 16 wherein the first coefficient of thermal expansion is greater than that of the molding layer, and wherein the second coefficient of thermal expansion is greater than that of the molding layer.

18. The package structure of claim 1, wherein fewer than all of the plurality of grooves are filled with the independent patch structures, and wherein a location of the plurality of grooves which are filled with the independent patch structures corresponds to locations of warpage of the package substrate.

19. The package structure of claim 1, wherein the package structure has a non-zero amount of warpage, and wherein the independent patch structures are placed into the subset of the plurality of grooves in locations configured to reduce the amount of warpage of the package structure.

20. The package structure of claim 19, wherein a material of a respective one of the independent patch structures filling a corresponding one of the plurality of grooves is selected according to the amount of warpage of the package structure corresponding to a location of the one of the plurality of grooves.

* * * * *